United States Patent
Paniccia et al.

[19]

[11] Patent Number: 6,049,639
[45] Date of Patent: Apr. 11, 2000

[54] METHOD AND APPARATUS PROVIDING OPTICAL INPUT/OUTPUT THROUGH THE BACK SIDE OF AN INTEGRATED CIRCUIT DIE

[75] Inventors: Mario J. Paniccia, Santa Clara; Valluri R. M. Rao, Saratoga, both of Calif.

[73] Assignee: Intel Corporation, Santa Clara, Calif.

[21] Appl. No.: 08/995,277

[22] Filed: Dec. 19, 1997

[51] Int. Cl.[7] .................................................. G02B 6/12
[52] U.S. Cl. .................................................. 385/14
[58] Field of Search ..................................... 385/14

[56] References Cited

U.S. PATENT DOCUMENTS

| | | | |
|---|---|---|---|
| 4,422,088 | 12/1983 | Gfeller | 385/37 |
| 4,695,120 | 9/1987 | Holder | 385/14 |
| 4,758,092 | 7/1988 | Heinrich et al. | 356/364 |
| 4,761,620 | 8/1988 | Bar-Joseph et al. | 359/263 |
| 4,865,427 | 9/1989 | Kingston et al. | 359/276 |
| 4,871,224 | 10/1989 | Karstensen et al. | 385/14 |
| 4,917,450 | 4/1990 | Pocholle et al. | 385/10 |
| 4,966,430 | 10/1990 | Weidel | 385/14 |
| 5,061,027 | 10/1991 | Richard | 385/14 |
| 5,153,770 | 10/1992 | Harris | 359/245 |
| 5,159,700 | 10/1992 | Reid et al. | 385/14 |
| 5,198,684 | 3/1993 | Sudo | 257/79 |
| 5,400,419 | 3/1995 | Heinen | 385/14 |
| 5,432,630 | 7/1995 | Lebby et al. | 359/152 |
| 5,434,434 | 7/1995 | Kasahara et al. | 257/84 |
| 5,485,021 | 1/1996 | Abe | 257/84 |
| 5,502,779 | 3/1996 | Magel | 385/1 |
| 5,568,574 | 10/1996 | Tanguay, Jr. et al. | 385/14 |
| 5,605,856 | 2/1997 | Goosen et al. | 438/24 |
| 5,625,636 | 4/1997 | Bryan et al. | 372/50 |
| 5,629,838 | 5/1997 | Knight et al. | 361/782 |
| 5,638,469 | 6/1997 | Feldman et al. | 385/14 |
| 5,696,862 | 12/1997 | Hauer et al. | 385/88 |
| 5,835,646 | 11/1998 | Yoshimura et al. | 385/14 |
| 5,864,642 | 1/1999 | Chun et al. | 385/14 |
| 5,872,360 | 2/1999 | Paniccia et al. | 250/341.4 |

OTHER PUBLICATIONS

Miller, DAB: "Reason and Prospects for Dense Optical Interconnections", Presentation by Stanford University Professor, (Oct. 1997).

Sakano, S. et al.: "InGaAsP/InP Monolithic Integrated Circuit with Lasers and an Optical Switch," *Electronics Letters*, 22(11), May 1986.

Mansuripur, M. and Goodman, JW: "Signal and Noise in Magneto-Optical Readout," *J. Appl. Phys.*, 53(6), Jun. 1982.

Heinrich, HK: "A Noninvasive Optical Probe for Detecting Electrical Signals in Silicon Integrated Circuits", Doctoral Dissertation, Stanford Univ., (Apr., 1987).

(List continued on next page.)

*Primary Examiner*—John D. Lee
*Assistant Examiner*—Michael J. Stahl
*Attorney, Agent, or Firm*—Blakely, Sokoloff, Taylor & Zafman LLP

[57] ABSTRACT

A method and an apparatus providing optical input/output in an integrated circuit. In one embodiment, optical modulators and demodulators, which are coupled to integrated circuit input/output nodes, are disposed on or within the back side semiconductor substrate of a flip chip packaged integrated circuit. Since a flip chip packaged integrated circuit die is utilized, full access to the optical modulators and demodulators is provided from the back side of the integrated circuit die for optical input/output. In one embodiment, a heat sink including a light source and an optical assembly is thermally and optically coupled to the back side of the integrated circuit die. A light beam is directed to the optical modulators and the deflected modulated light beam is routed and directed to the optical demodulators to realize optical input/output. In one embodiment, infrared light may be utilized such that the optical modulators and demodulators are disposed within a silicon semiconductor substrate. Since silicon is partially transparent to infrared light, optical input/output is realized through the back side and through the semiconductor substrate of the flip chip packaged integrated circuit die.

34 Claims, 6 Drawing Sheets

OTHER PUBLICATIONS

Alping, A et al.: "Highly Efficient Waveguide Phase Modulator for Integrated Optoelectronics," *Appl. Phys. Lett.*, 48(19), May 1986.

Levitan, SP et al.: "Computer–Aided Design of Free–Space Opto–Electronic Systems," *DAC 97*, Anaheim, California (1997), no month available.

Goodman, JW et al.: "Optical Interconnections for VLSI Systems," *Proc. IEEE*, 72(7), Jul. 1984.

Wang, C. et al.: "Ultrafast, All–Silicon Light Modulator," *Optics Letters*, 19(18), Sep. 1994.

Tada, K. and Okada, Y: "Bipolar Transistor Carrier–Injected Optical Modulator/Switch: Proposal and Analysis," *IEEE Electr Dev Ltrs*, 7(11),(Nov.) 1986.

Fernando, C. et al: "Si/Si$_{0.85}$/GE$_{0.15}$Si P–I–N Waveguide Optical Intensity Modulator," *SPIE*, vol. 2402(131), 1995, no month available.

Raybon, G., et al.: "A Reconfigurable Optoelectronic Wavelength Converter based on an Integrated Electroabsorption Modulated Laser Array" in *1997 Digest of the IEEE/LEOS Summer Topical Meetings*, Montreal, Quebec, Canada, Aug. 1997.

Reiley, DJ, and Sasian JM: "Optical Design of a Free–Space Photonic Switching System" in *Applied Optics*, vol. 36(19), Jul. 1997.

Koren, U., et al.: "A Polarization Insensitive Semiconductor Optical Amplifier with Integrated Electroabsorption Modulators" in *Integrated Photonics Research*, Apr. 29–May 2, 1996 Technical Digest Series, vol. 6, 1996.

Krishnamoorthy, AV, and Miller, DAB: "Free–Space Optical Interconnections for VLSI Systems: A Technology Roadmap", Conference Proceedings Leos '96 9th Annual MeetingU IEEE Lasers and Electro–Optics (vol. 1), Nov. 1996.

Goosen, KW: "GaAs MQW Modulators Integrated With Silicon CMOS" in *IEEE Photonics Technology Letters*, vol. 7(4), Apr. 1995.

"Optoelectronic VLSI Foundry Services From Lucent Technologies", *Lucent Technologies Bell Labs Innovations Web Page* at http://www.bell–labs.com/project/oevlsi/, updated Mar. 2, 1997.

"Process for Fabricating OE/VLSI Chips", *Lucent Technologies Bell Labs Innovations Web Page* at http://www-.bell–labs.com/project/oevlsi/wfabproc.html, updated Sep. 26, 1996.

"Detailed Design Rules for Workshop Chips", , *Lucent Technologies Bell Labs Innovations Web Page* http://www-.bell–labs.com/project/oevlsi/wdesrule.html, updated Mar. 7, 1997.

Kuwamura, Y, et al.: "Analysis of Operating Mechanism in Semiconductor Optical Modulator with Electron–Depleting Absorption Control" in *Electronics and Communications in Japan*, vo. 79(5), Dec. 1995.

Liu, MY and Chou, SY: "High–Modulation–Depth and Short–Cavity–Length Silicon Fabry–Perot Modulator with Two Grating Bragg Reflectors" in *Appl. Phys. Lett.* vol. 68(2), Jan. 1996.

Orobtchouk, R., et al.: "Quasi–TEoo Singlemode Optical Waveguides for Electro–optical Modulation at 1.3 μm Using Standard SIMOX Material" in *IEEE Proc. Optoelectron*, vol. 144(2) Apr. 1997.

Soref, RA: "Electrooptical Effects of Silicon" in *IEEE J of Quantum Electron*. vol. QE–23(1), Jan. 1997.

Cutolo, A., et al.: "An Electrically Controlled Bragg Reflector Integrated in a Rib Silicon on Insulator Waveguide" in *Appl. Phys. Lett.* vol. 71(2), Jul. 1997.

Cutolo, A., et al.: Silicon Electro–Optic Modulator Based on a Three Terminal Device Integrated in a Low–Loss Single–Mode SOI Waveguide in *J. of Lightwave Technology*, vol. 15(3), Mar. 1997.

METHOD AND APPARATUS PROVIDING OPTICAL INPUT/OUTPUT THROUGH THE BACK SIDE OF AN INTEGRATED CIRCUIT DIE

RELATED APPLICATIONS

This application is also related to co-pending application Ser. No. 08/994,980, filed Dec. 19, 1997, entitled "Method And Apparatus Providing An Optical Input/Output Bus Through The Back Side Of An Integrated Circuit Die," and assigned to the Assignee of the present application.

This application is also related to co-pending application Ser. No. 08/993,786, filed Dec. 19, 1997, entitled "Method And Apparatus For Optically Modulating Light Through The Back Side Of An Integrated Circuit Die," and assigned to the Assignee of the present application.

BACKGROUND OF THE INVENTION

1. Field of the Invention

The present invention relates generally to integrated circuit input/output and, more specifically, the present invention relates to the optical coupling of integrated circuit input/outputs.

2. Background Information

Within the integrated circuit industry there is a continuing effort to increase integrated circuit speed as well as device density. One challenge that integrated circuit designers face with increasing circuit speeds and device densities is the increasingly significant propagation delays of circuit inputs and outputs due to the capacitive loading associated with circuit connections. At slower clock speeds, the capacitive loading on integrated circuit lines is generally not a significant factor. However, as newer integrated circuit design clock speeds continue to climb towards the gigahertz range and beyond, it is evident that one of the major bottlenecks for future integrated circuits, such as for example but not limited to microprocessors, off chip caches, controllers, etc., is the input/output bandwidth and/or round trip delay between and within chips.

Prior art attempts to address the capacitive loading problems associated with increased integrated circuit speeds and device densities have resulted in the use of larger and more powerful integrated circuit input/output drivers on the chip. An undesirable consequence of utilizing larger input/output drivers is that the larger input/output drivers generally consume more power, dissipate more heat and occupy more of valuable area on the integrated circuit die than smaller integrated circuit input/output drivers.

Other prior art attempts to overcome traditional integrated circuit connection limitations have included the use of optical interconnections. Some approaches at optically interconnecting integrated circuits are based on using either gallium arsenide (GaAs) laser diodes and modulating or switching the diodes electrically, or secondly, by using gallium and arsenide-built modulators that amplitude modulate a laser beam passing through an integrated circuit. The modulation used in these prior art approaches is based on electroabsorbtion through strained multi-layer grown molecular beam epitaxy (MBE) films in GaAs integrated circuits. As can be appreciated to those skilled in the art, it is difficult and therefore impractical to integrate or combine III-V based technology, which includes GaAs, with standard silicon based complementary metal oxide semiconductor (CMOS) technology.

Accordingly, what is desired is a method and an apparatus providing high speed optical input/output in an integrated circuit. Such a method and apparatus should enable high speed optical input/output and be compatible with present day CMOS integrated circuit technology. Such a method and apparatus should also enable the use of relatively smaller integrated circuit input/output drivers such that reduced amounts of power are consumed and less integrated circuit die area is occupied.

SUMMARY OF THE INVENTION

An integrated circuit device is disclosed. In one embodiment, the disclosed integrated circuit includes an optical modulator coupled to a first integrated circuit node, an optical demodulator coupled to a second integrated circuit node, a light source generating a light beam, and an optical assembly optically coupling the optical modulator, the optical demodulator and the light source. The disclosed light beam is directed to the optical modulator such that a modulated light beam is deflected therefrom in response to an output signal at the first integrated circuit node. The disclosed optical modulator is optically coupled to the optical demodulator via the deflected modulated light beam such that an input signal is generated at the second integrated circuit node in response to the output signal. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus providing optical input/output in an integrated circuit is disclosed. In the following description numerous specific details are set forth in order to provide a thorough understanding of the present invention.

It will be apparent, however, to one having ordinary skill in the art that the specific detail need not be employed to practice the present invention. In other instances, well-known materials or methods have not been described in detail in order to avoid obscuring the present invention.

The present invention provides optical input/output in an integrated circuit by optically routing input/output signals between integrated circuit nodes. In one embodiment, input/output signals are optically routed back and forth through the back side semiconductor substrate of a flip chip packaged integrated circuit using present day silicon-based CMOS technology. Since the input/output signals are optically coupled, the electrical loading problems that plague prior art input/output interconnections are reduced, thereby enabling increased input/output bandwidth using smaller integrated circuit input/output drivers. With smaller integrated circuit input/output drivers, integrated circuit chip area and power are conserved.

Figure 1A:
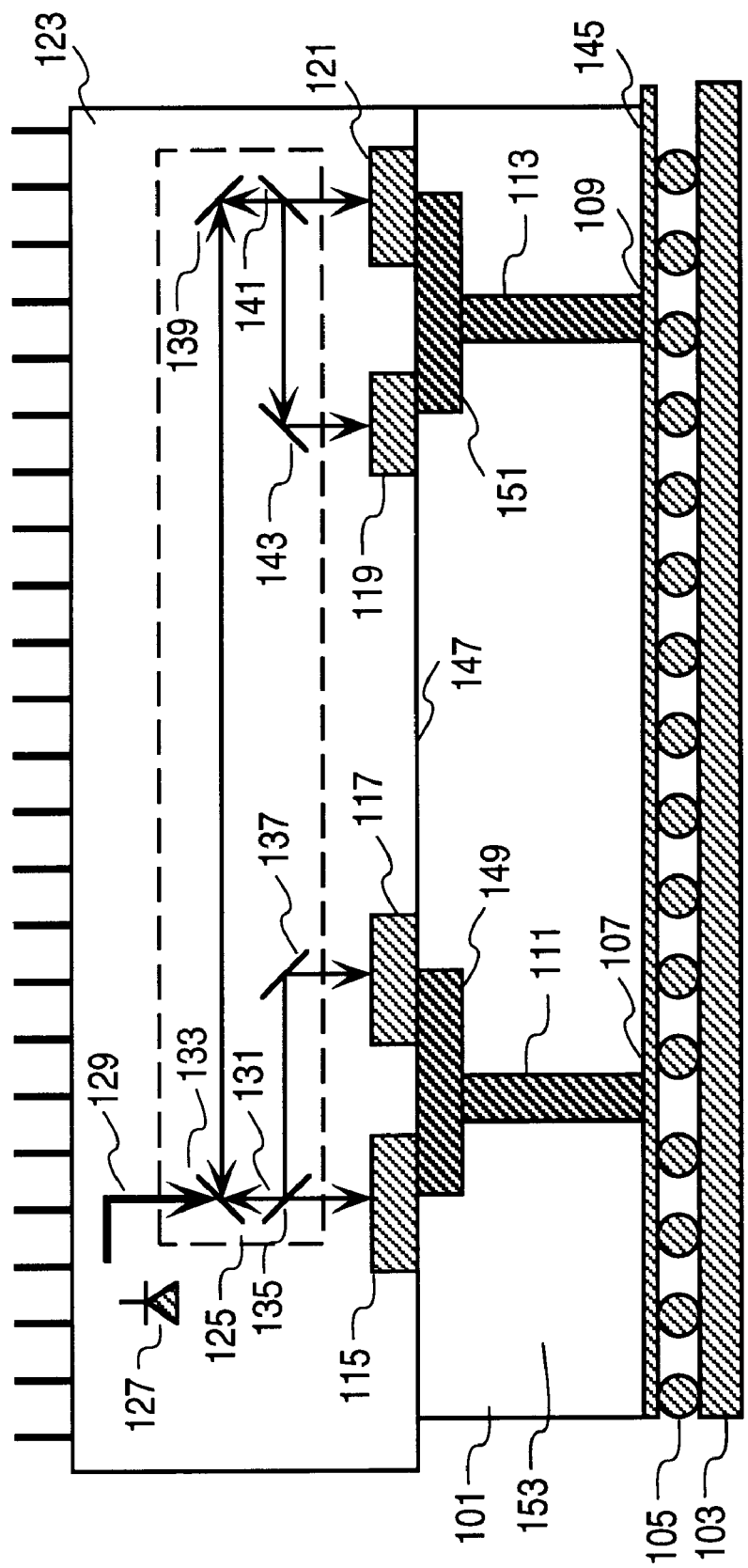
FIG. 1A is an illustration of a cross section of a flip chip packaged integrated circuit die and an attached heat sink with optical input/output in accordance with the teachings of the present invention.

FIG. 1A is an illustration of one embodiment of an integrated circuit die 101 including optical input/output in accordance with the teachings of the present invention. In one embodiment, integrated circuit die 101 is a controlled collapse circuit connection (C4) or flip chip packaged integrated circuit die coupled to package substrate 103 through ball bonds 105. As can be appreciated to those skilled in the art, ball bonds 105 provide more direct connections between the internal integrated circuit nodes of integrated circuit die 101 and the pins of packaged substrate 103, thereby reducing inductance problems associated with typical wire bond integrated circuit packaging technologies. Another characteristic of flip chip packaging is that full access to the back side 147 of integrated circuit die 101 is provided.

In one embodiment, integrated circuit die 101 includes a first integrated circuit node 107 and a second integrated circuit node 109. As shown in FIG. 1A, electrical signals at first integrated circuit node 107 are transferred back and forth from the front side 145 of integrated circuit die 101 through the semiconductor substrate 153 of integrated circuit die 101 through a first via 111 to the back side 147. Similarly, electrical signals at second integrated circuit node 109 are transferred back and forth through semiconductor substrate 153 through a second via 113 from the front side 145 to the back side 147.

In one embodiment, first and second vias 111 and 113 are etched or micro-machined from the back side 147 of flip chip packaged integrated circuit die 101. Vias 111 and 113 may then be filled with a conductive material, such as for example but not limited to aluminum, copper, platinum, gold, etc., or the conductive material may then be deposited along the side walls of the etched vias 111 and 113. A first back side pad 149 is then disposed on the back side 147 and coupled to via 111. Similarly, a second back side pad 151 is disposed on back side 147 and coupled to via 113. In one embodiment, back side pads 149 and 151 include conductive material, such as for example but not limited to aluminum, copper, platinum, gold, etc. As a result, vias 111 and 113 transfer input/output voltages back and forth between front side 145 to back side 147 of integrated circuit die 101.

In one embodiment, a thermal conductor or heat sink 123 is thermally and optically coupled to back side 147 of integrated circuit die 101, as shown in FIG. 1A. In particular, heat sink 123 includes a first optical modulator 115 and a first optical demodulator 117 coupled to first back side pad 149. Similarly, heat sink 123 also includes second optical demodulator 119 and second optical modulator 121 coupled to second back side pad 151. In one embodiment, heat sink 123 also includes a light source 127 and an optical assembly 125. As illustrated in FIG. 1A, optical assembly 125 includes elements that optically couple light source 127, first and second optical modulators 115 and 121, and first and second optical demodulators 117 and 119. It is noted that other optical assemblies for optically coupling integrated circuit input/outputs through the back side of flip chip packaged integrated circuits are described in co-pending application Ser. No. 08/994,980, filed Dec. 19, 1997, entitled "Method And Apparatus Providing An Optical Input/Output Bus Through The Back Side Of An Integrated Circuit Die," and assigned to the Assignee of the present application.

In one embodiment, light source 127 generates a light beam 129, which is received by optical assembly 125. In one embodiment, light source 127 is a laser diode. In the embodiment shown in FIG. 1A, light beam 129 passes through a first beam splitter/deflector 133 and a second beam splitter/deflector 135 and is directed to first optical modulator 115. In one embodiment, optical modulator 115 modulates light beam 129 in response to an electrical output signal at integrated circuit node 107. Accordingly, a deflected light beam 131, which is modulated in response to the electrical output signal at integrated circuit node 107, passes back through second beam splitter/deflector 135 and is deflected from first beam splitter/deflector 133 to a fourth beam splitter/deflector 139, which deflects deflected light beam 131 to a fifth beam splitter/deflector 141, which deflects deflected light beam 131 to a sixth beam splitter/deflector 143, which then directs deflected light beam 131 to second optical demodulator 119. In one embodiment, second optical demodulator 119 demodulates the modulated deflected light beam 131 to reproduce the electrical output signal generated at integrated circuit node 107 to produce an input signal that is received at second integrated circuit node 109 through via 113.

In one embodiment, it is noted that a portion of deflected light beam 131 also passes through fifth beam splitter/deflector 141 such that deflected light beam 131 is directed to second optical modulator 121. In one embodiment, second optical modulator 121 modulates deflected light beam 131 that is deflected from optical modulator 121 in response to an output signal at second integrated circuit node 109. The deflected light beam 131 that is modulated in response to the output signal at second integrated circuit node 109 and deflected from second optical modulator 121 passes back through fifth beam splitter/deflector 141 and is deflected from fourth beam splitter/deflector 139. Deflected light beam 131 is then deflected from first beam splitter/deflector 133, which is then deflected from second beam splitter/deflector 135, which is then deflected from third beam splitter/deflector 137, which is then directed to first optical demodulator 117. In one embodiment, optical demodulator 117 demodulates the modulated deflected beam 131 such that the output signal at second integrated circuit node 109 is reproduced as an input signal at first integrated circuit node 107.

Therefore, optical input/output is realized between first and second integrated circuit nodes 107 and 109 through the semiconductor substrate 153 and the back side 147 of integrated circuit die 101 through the optical assembly 125 of heat sink 123, which is thermally and optically coupled to the back side 147 of integrated circuit die 101. In one embodiment, semiconductor substrate 153 includes silicon and integrated circuit die 101 includes existing present day CMOS processing technology.

In one embodiment, first and second optical modulators 115 and 121, and first and second optical demodulators 117 and 119 utilize electro-optic crystals, or other well known devices to modulate and demodulate light beam 129 and deflected light beam 131 as discussed above. With the back side optical input/output of the present invention, there is a reduced need to drive large external capacitive loads, which results in smaller input/output driver circuitry in integrated circuit die 101. This result has the benefit of less integrated circuit die area being sacrificed for large input/output driver circuitry and therefore results in a smaller integrated circuit die 101.

In addition, with smaller integrated circuit input/output drivers in integrated circuit die 101, a reduced amount of power is consumed in accordance with the teachings of the presently described optical input/output configuration. Furthermore, by using optical based input/output signals between the nodes of an integrated circuit, the round trip delay of signals passing between the nodes of an integrated circuit is also reduced, resulting in even faster integrated circuit performance.

Another benefit of the optical input/output configuration of the present invention is that there is also a reduction in noise since there will be no more ground bouncing or other effects commonly found in electrical input/outputs. In addition, by not being constrained any longer with the need for placing input/output circuitry around the perimeter of an integrated circuit die, a significant reduction in integrated circuit die area and chip layout may also be possible.

In another embodiment, the optical input/output method and apparatus of the present invention may be utilized for interchip optical input/output operations. For instance, the optical input/output of the present invention may also be used for communications between a plurality of flip chip packaged integrated circuit dice, such as for example but not limited to optical input/output between central processing units (CPUs) and off chip caches. Other embodiments of the present invention may be utilized with multiprocessor connections, multichip module (MCM) and processor card based technology, in addition to the intrachip optical input/output connection described in FIG. 1A.

Figure 1B:
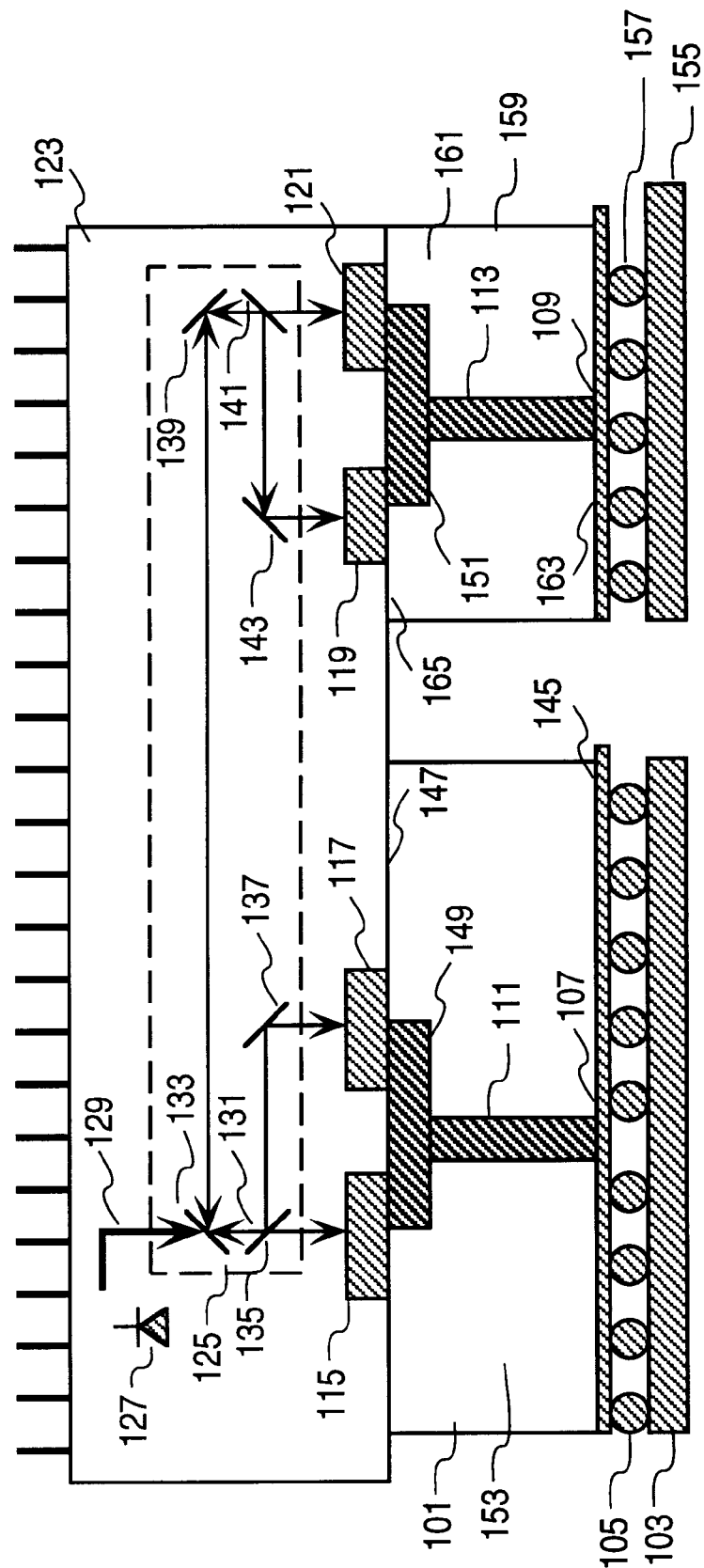
FIG. 1B is an illustration of a cross section of a plurality of flip chip packaged integrated circuit dice and an attached heat sink with optical input/output in accordance with the teachings of the present invention.

To illustrate, FIG. 1B is an illustration of another embodiment of optical input/output in an integrated circuit in accordance with the teachings of the present invention. As shown in FIG. 1B, a first integrated circuit die 101, which is a flip chip packaged integrated circuit die, is coupled to a first package substrate 103 through ball bonds 105. A second integrated circuit die 159, which is also a flip chip packaged integrated circuit die, is coupled to a second package substrate 155 through ball bonds 157. In one embodiment, first integrated circuit die 101 may be a CPU and second integrated circuit die 159 may be an off-chip cache. It is appreciated that other chip combinations with a plurality of integrated circuit dice may utilize optical input/output in accordance with the teachings of the present invention. In yet another embodiment, first and second integrated circuit dice 101 and 159 may both be coupled to the same package substrate and include optical input/output in accordance with the teachings of the present invention. Such an embodiment could be utilized in, for example, MCM configurations.

Referring back to the embodiment illustrated in FIG. 1B, integrated circuit die 101 includes a first integrated circuit node 107. Second integrated circuit die 159 includes a second integrated circuit node 109. As shown in FIG. 1B, electrical signals at first integrated circuit node 107 are brought up from the front side 145 of first integrated circuit die 101 through the semiconductor substrate 153 of integrated circuit die 101 through a first via 111 to the back side 147. Similarly, electrical signals at second integrated circuit node 109 are brought up through semiconductor substrate 161 through a second via 113 from a front side 163 to a back side 165 of second integrated circuit die 159.

In one embodiment, a first back side pad 149 is disposed on the back side 147 and coupled to via 111. Similarly, a second back side pad 151 is disposed on back side 165 and coupled to via 113. As a result, via 111 transfers input/output voltages back and forth from front side 145 to back side 147 of integrated circuit die 101 and via 113 transfers input/output voltages back and forth from front side 163 to back side 165 of integrated circuit die 159.

In one embodiment, a thermal conductor or heat sink 123 is thermally and optically coupled to back sides 147 and 165 of integrated circuit dice 101 and 159, respectively. Heat sink 123 of FIG. 1B corresponds to and performs substantially the same function as heat sink 123 of FIG. 1A.

Therefore, optical input/output is realized between first and second integrated circuit nodes 107 and 109 of first and second integrated circuit dice 101 and 159, respectively, in accordance with the teachings of the present invention. In one embodiment, semiconductor substrates 153 and 161 include silicon and integrated circuit dice 101 and 159 include existing present day CMOS processing technology.

Figure 2A:
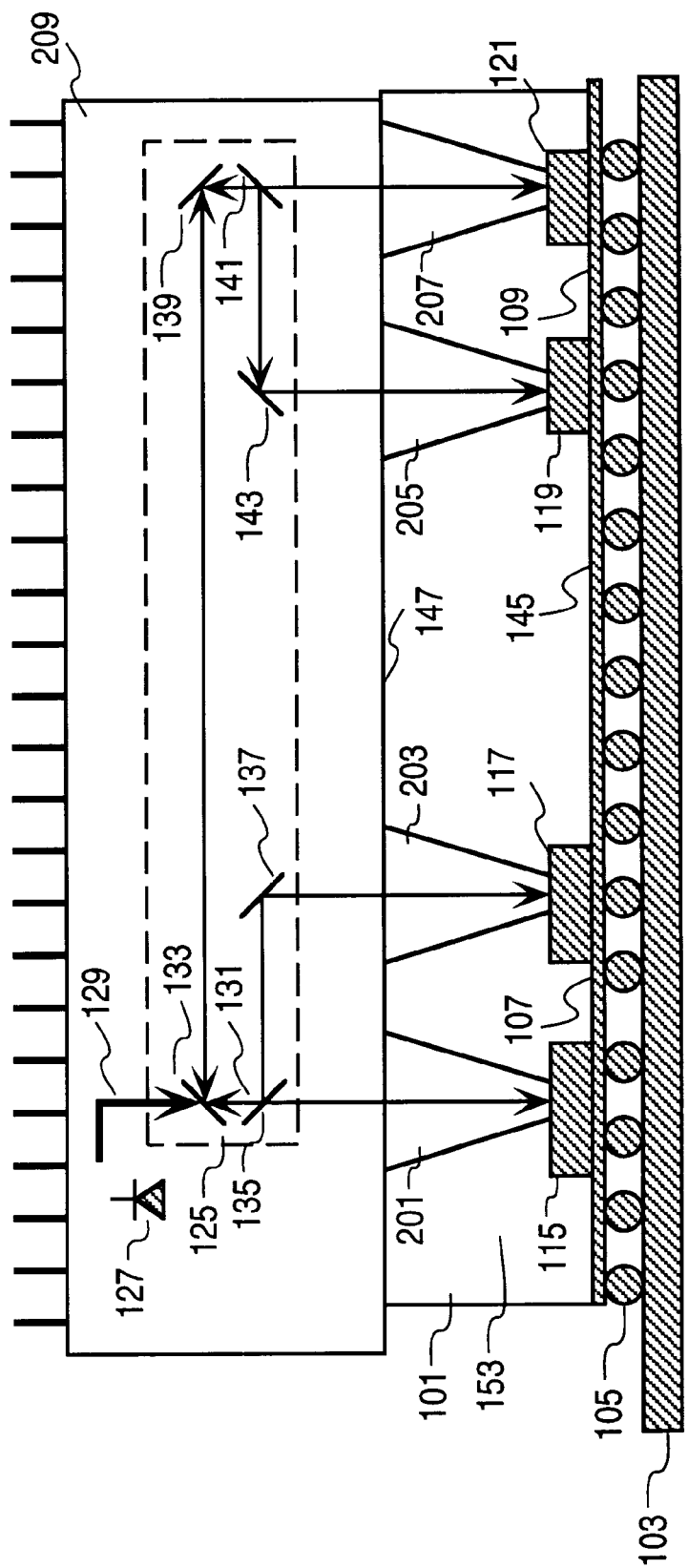
FIG. 2A is an illustration of a cross section of a flip chip packaged integrated circuit die with optical modulators and demodulators disposed in trenches and an attached heat sink with optical input/output in accordance with the teachings of the present invention.

FIG. 2A is in illustration of another embodiment of an integrated circuit die 101 including optical input/output in accordance with the teachings of the present invention. In one embodiment, integrated circuit die 101 is a flip chip packaged integrated circuit die coupled to package substrate 103 through ball bonds 105.

In one embodiment, semiconductor substrate 153 of integrated circuit die 101 includes first, second, third and fourth recesses 201, 203, 205 and 207, respectively. In one embodiment, first, second, third and fourth recesses 201, 203, 205 and 207 are etched or micro-machined using known techniques directly into semiconductor substrate 153 from a back side 147 of integrated circuit die 101, as shown in FIG. 2A. In one embodiment, a first optical modulator 115 is disposed in first recess 201, a first optical demodulator 117 is disposed in second recess 203, a second optical demodulator 119 is disposed in third recess 205 and a second optical modulator 121 is disposed in fourth recess 207. In one embodiment, first optical modulator 115 and first optical demodulator 117 are coupled to a first integrated circuit node 107, and second optical demodulator 119 and second optical modulator 121 are coupled to a second integrated circuit node 109 in integrated circuit die 101. In one embodiment, first and second optical modulators 115 and 121, and first and second optical demodulators 117 and 119 utilize electro-optic crystals, or other well known devices to modulate and demodulate light.

As will be discussed in greater detail below, first, second, third and fourth recesses 201, 203, 205 and 207 form optical passages that enable first optical modulator 115, first optical demodulator 117, second optical demodulator 119 and second optical modulator 121 to be optically coupled enabling optical input/output. In one embodiment, first, second, third and fourth recesses 201, 203, 205 and 207 are also filled with an optically transparent material, such as for example but not limited to glass, that allows light to pass through the optical passages, thereby allowing the optical coupling of first optical modulator 115, first optical demodulator 117, second optical demodulator 119 and second optical modulator 121.

In one embodiment, a thermal conductor or heat sink 209 is thermally and optically coupled to back side 147 of integrated circuit die 101, as shown in FIG. 2A. In one embodiment, heat sink 209 is similar to heat sink 123 of FIGS. 1A and 1B insofar as heat sink 209 also includes a light source 127 and an optical assembly 125. However, heat sink 209 of FIG. 2A does not include a first optical modulator 115, a first optical demodulator 117, a second optical demodulator 119 and a second optical modulator 121 because these elements are instead disposed in first, second, third and fourth recesses 201, 203, 205 and 207, respectively.

In one embodiment, light source 127 generates a light beam 129, which is received by optical assembly 125. In the embodiment shown in FIG. 2A, light beam 129 passes through a first beam splitter/deflector 133 and a second beam splitter/deflector 135 and is directed to first optical modulator 115 disposed in first recess 201. In one embodiment, optical modulator 115 modulates light beam 129 in response to an electrical output signal at first integrated circuit node 107 in integrated circuit die 101. Accordingly, a deflected light beam 131, which is modulated in response to the electrical output signal at first integrated circuit node 107, passes back through second beam splitter/deflector 135 and is deflected from first beam splitter/deflector 133 to a fourth beam splitter/deflector 139, which deflects deflected light beam 131 to a fifth beam splitter/deflector 141, which deflects deflected light beam 131 to a sixth beam splitter/deflector 143, which then directs deflected light beam 131 to second optical demodulator 119 disposed in recess 205. In one embodiment, second optical demodulator 119 demodulates the modulated deflected light beam 131 to reproduce the electrical output signal generated at first integrated circuit node 107 to produce an input signal that is received at second integrated circuit node 109 in integrated circuit die 101.

In one embodiment, it is noted that a portion of deflected light beam 131 also passes through fifth beam splitter/deflector 141 such that deflected light beam 131 is directed to second optical modulator 121 disposed in recess 207. In one embodiment, second optical modulator 121 modulates the deflected light beam 131 that is deflected from optical modulator 121 in response to an output signal at second integrated circuit node 109. The deflected light beam 131 that is modulated in response to the output signal at second integrated circuit node 109 and deflected from second optical modulator 121 passes back through fifth beam splitter/deflector 141 and is deflected from fourth beam splitter/deflector 139. Deflected light beam 131 is then deflected from first beam splitter/deflector 133, which is then deflected from second beam splitter/deflector 135, which is then deflected from third beam splitter/deflector 137, which is then directed to first optical demodulator 117 disposed in second recess 203. In one embodiment, optical demodulator 117 demodulates the modulated deflected beam 131 such that the output signal at second integrated circuit node 109 is reproduced as an input signal at first integrated circuit node 107.

Therefore, optical input/output is realized between first and second integrated circuit nodes 107 and 109 through the semiconductor substrate 153 and the back side 147 of integrated circuit die 101 through the optical assembly 125 of heat sink 123, which is thermally and optically coupled to the back side 147 of integrated circuit die 101. In one embodiment, semiconductor substrate 153 includes silicon and integrated circuit die 101 includes existing present day CMOS processing technology.

Figure 2B:
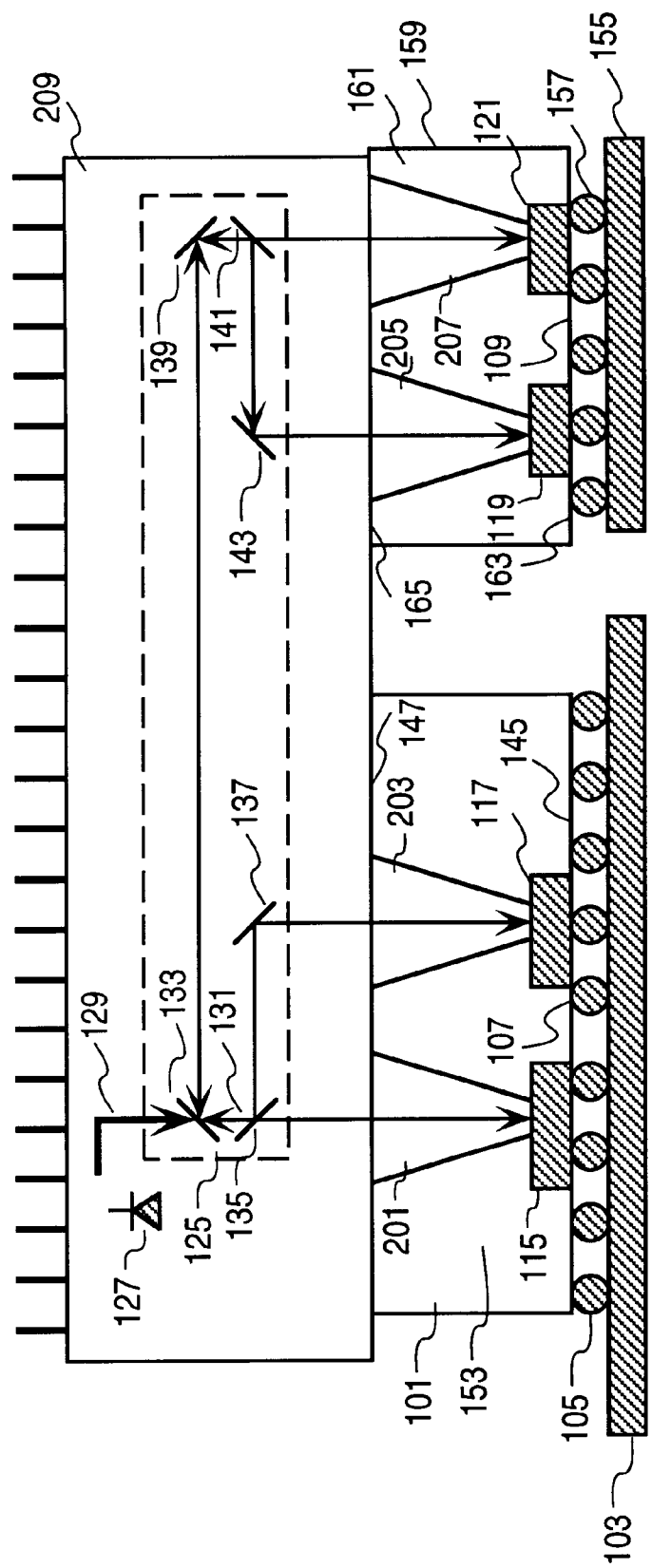
FIG. 2B is an illustration of a cross section of a plurality of flip chip packaged integrated circuit dice with optical modulators and demodulators disposed in trenches and an attached heat sink with optical input/output in accordance with the teachings of the present invention.

FIG. 2B is an illustration of another embodiment of optical input/output in an integrated circuit in accordance with the teachings of the present invention. As shown in FIG. 2B, a first integrated circuit die 101, which is a flip chip packaged integrated circuit die, is coupled to a first package substrate 103 through ball bonds 105. A second integrated circuit die 159, which is also a flip chip packaged integrated circuit die, is coupled to a second package substrate 155 through ball bonds 157. In still another embodiment, first and second integrated circuit dice 101 and 159 may both be coupled to the same package substrate and include optical input/output in accordance with the teachings of the present invention.

In one embodiment, semiconductor substrate 153 of integrated circuit die 101 includes first and second recesses 201 and 203. Semiconductor substrate 161 of integrated circuit die 159 includes third and fourth recesses 205 and 207. In one embodiment, first, second, third and fourth recesses 201, 203, 205 and 207 are etched or micro-machined using known techniques directly into semiconductor substrates 153 and 161, respectively, from back sides 147 of integrated circuit die 101, and 165 of integrated circuit die 159, respectively. In one embodiment, a first optical modulator 115 is disposed in first recess 201, a first optical demodulator 117 is disposed in second recess 203, a second optical demodulator 119 is disposed in third recess 205 and a second optical modulator 121 is disposed in fourth recess 207. First, second, third and fourth recesses 201, 203, 205 and 207 form optical passages that enable first optical modulator 115, first optical demodulator 117, second optical demodulator 119 and second optical modulator 121 to be optically coupled enabling optical input/output.

In one embodiment, first optical modulator 115 and first optical demodulator 117 are coupled to a first integrated circuit node 107 in integrated circuit die 101, and second optical demodulator 119 and second optical modulator 121 are coupled to a second integrated circuit node 109 in integrated circuit die 159. In one embodiment, first and second optical modulators 115 and 121, and first and second optical demodulators 117 and 119 utilize electro-optic crystals, or other well known devices to modulate and demodulate light.

In one embodiment, a thermal conductor or heat sink 209 is thermally and optically coupled to back sides 147 and 165 of integrated circuit dice 101 and 159, respectively. Heat sink 209 of FIG. 2B corresponds to and performs substantially the same function as heat sink 209 of FIG. 2A.

Therefore, optical input/output is realized between first and second integrated circuit nodes 107 and 109 of first and second integrated circuit dice 101 and 159, respectively, in accordance with the teachings of the present invention. In one embodiment, semiconductor substrates 153 and 161 include silicon and integrated circuit dice 101 and 159 include existing present day CMOS processing technology.

Figure 3A:
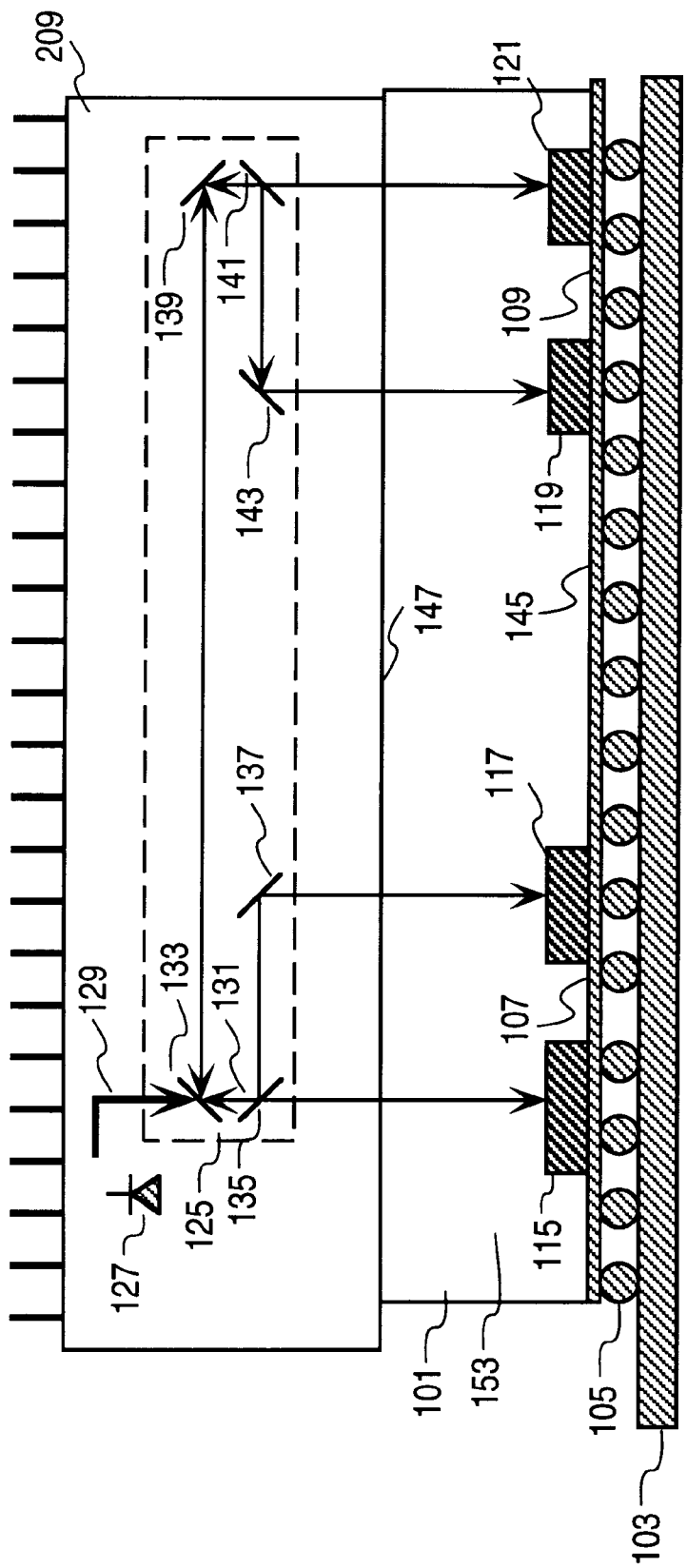
FIG. 3A is an illustration of a cross section of a flip chip packaged integrated circuit die with optical modulators and demodulators disposed within the semiconductor substrate and an attached heat sink with optical input/output in accordance with the teachings of the present invention.

FIG. 3A is an illustration of yet another embodiment of an integrated circuit die 101 including optical input/output in accordance with the teachings of the present invention. In one embodiment, integrated circuit die 101 is a flip chip packaged integrated circuit die coupled to package substrate 103 through ball bonds 105.

In one embodiment, semiconductor substrate 153 is silicon-based and includes existing present day CMOS processing technology. In one embodiment, a first optical modulator 115, a first optical demodulator 117, a second optical demodulator 119 and a second optical modulator 121 is disposed within semiconductor substrate 153, as illustrated in FIG. 3A. In one embodiment, first optical modulator 115 and first optical demodulator 117 are coupled to a first integrated circuit node 107, and second optical demodulator 119 and second optical modulator 121 are coupled to a second integrated circuit node 109 in integrated circuit die 101.

In one embodiment, first and second optical modulators 115 and 121 utilize known semiconductor-based optical modulating techniques, such as for example but not limited to silicon-based optical modulation, polysilicon-based optical modulation, waveguide-based optical modulation, plasma optical modulation, etc. In one embodiment, first and second optical demodulators 117 and 119 utilize known optical demodulation techniques, such as for example but not limited to an active diffusion photo-diode. It is noted that other optical modulator and demodulators used for optically coupling integrated circuit input/outputs through the back side silicon substrate of flip chip packaged integrated circuit dice are described in co-pending application Ser. No. 08/993,786, filed Dec. 19, 1997, entitled "Method And Apparatus For Optically Modulating Light Through The Back Side Of An Integrated Circuit Die," and assigned to the Assignee of the present application.

In one embodiment, a thermal conductor or heat sink 209 is thermally and optically coupled to back side 147 of integrated circuit die 101, as shown in FIG. 3A. In one embodiment, heat sink 209 of FIG. 3A is similar to heat sink 209 of FIGS. 2A and 2B insofar as heat sink 209 of FIG. 3A also includes a light source 127 and an optical assembly 125. However, in the embodiment illustrated in FIG. 3A, light source 127 generates infrared light. For example, in one embodiment, light source 127 is an infrared laser diode. As is known to those skilled in the art, silicon is partially transparent to infrared light. Therefore, using the infrared light generated by light source 127, first optical modulator 115, first optical demodulator 117, second optical demodulator 119 and second optical modulator 121 are optically coupled through the silicon-based semiconductor substrate 153 through back side 147 of integrated circuit die 101.

In one embodiment, light source 127 generates an infrared light beam 129, which is received by optical assembly 125. In the embodiment shown in FIG. 3A, light beam 129 passes through a first beam splitter/deflector 133 and a second beam splitter/deflector 135 and is directed to first optical modulator 115 through semiconductor substrate 153 through back side 147. Indeed, since light beam 129 is infrared light and since semiconductor substrate 153 is silicon, light beam 129 penetrates and passes through semiconductor substrate 153 to reach first optical modulator 115 from back side 147.

In one embodiment, optical modulator 115 modulates light beam 129 in response to an electrical output signal at first integrated circuit node 107 in integrated circuit die 101. Accordingly, a deflected light beam 131, which is modulated in response to the electrical output signal at first integrated circuit node 107, is deflected from first optical modulator 115 and passes back through and out semiconductor substrate 153, through second beam splitter/deflector 135 and is deflected from first beam splitter/deflector 133 to a fourth beam splitter/deflector 139, which deflects deflected light beam 131 to a fifth beam splitter/deflector 141, which deflects deflected light beam 131 to a sixth beam splitter/deflector 143, which then directs deflected light beam 131 to second optical demodulator 119 through semiconductor substrate 153 through back side 147. In one embodiment, second optical demodulator 119 demodulates the modulated deflected light beam 131 to reproduce the electrical output signal generated at first integrated circuit node 107 to produce an input signal that is received at second integrated circuit node 109 in integrated circuit die 101.

In one embodiment, it is noted that a portion of deflected light beam 131 also passes through fifth beam splitter/deflector 141 such that deflected light beam 131 is directed to second optical modulator 121 through semiconductor substrate 153 through back side 147. In one embodiment, second optical modulator 121 modulates deflected light beam 131 that is deflected from optical modulator 121 in response to an output signal at second integrated circuit node 109. The deflected light beam 131 that is modulated in response to the output signal at second integrated circuit node 109 and deflected from second optical modulator 121 passes back through semiconductor substrate 153, through back side 147, through fifth beam splitter/deflector 141 and is deflected from fourth beam splitter/deflector 139. Deflected light beam 131 is then deflected from first beam splitter/deflector 133, which is then deflected from second beam splitter/deflector 135, which is then deflected from third beam splitter/deflector 137, which is then directed to first optical demodulator 117 through semiconductor substrate 153 through back side 147. In one embodiment, optical demodulator 117 demodulates the modulated deflected beam 131 such that the output signal at second integrated circuit node 109 is reproduced as an input signal at first integrated circuit node 107.

Therefore, in one embodiment, optical input/output is realized between first and second integrated circuit nodes 107 and 109 using infrared light through the silicon semiconductor substrate 153 and the back side 147 of integrated circuit die 101 through the optical assembly 125 of heat sink 123, which is thermally and optically coupled to the back side 147 of integrated circuit die 101.

Figure 3B:
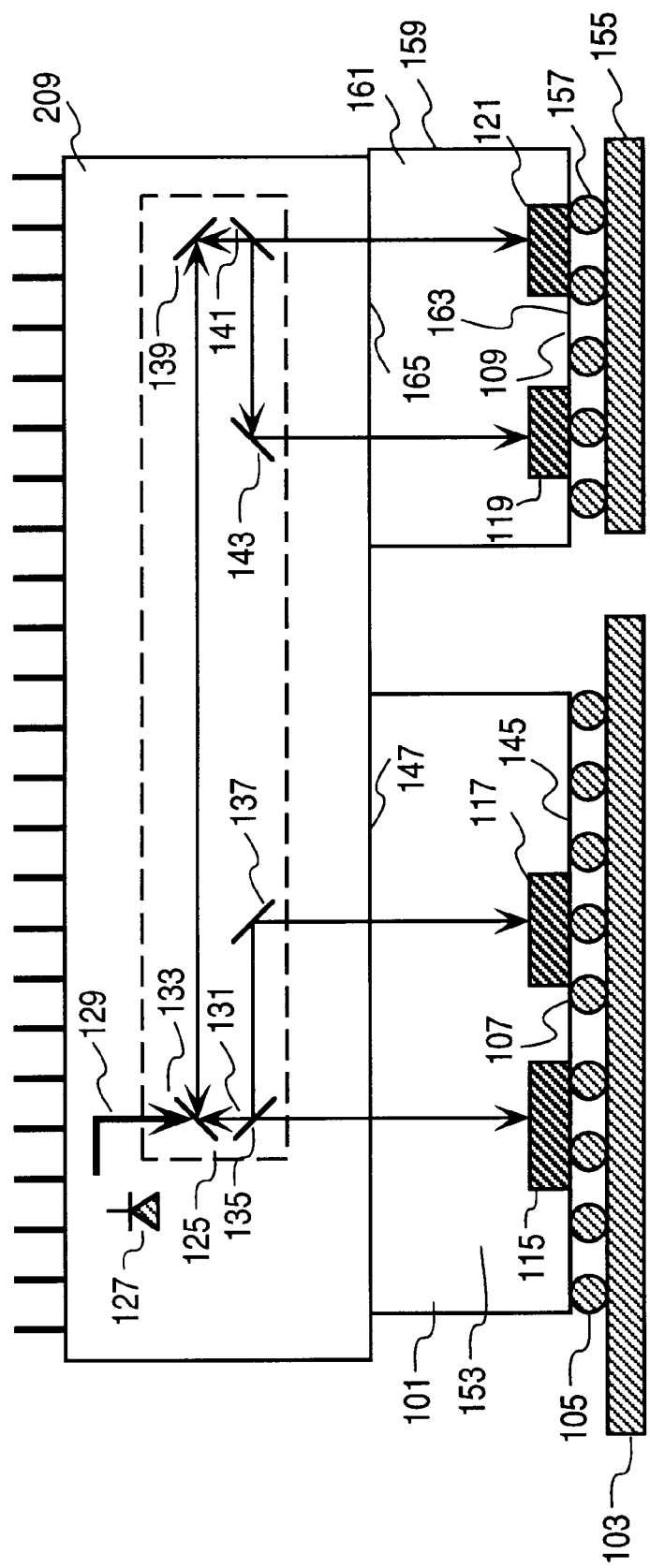
FIG. 3B is an illustration of a cross section of a plurality of flip chip packaged integrated circuit dice with optical modulators and demodulators disposed within the semiconductor substrate and an attached heat sink with optical input/output in accordance with the teachings of the present invention.

FIG. 3B is an illustration of another embodiment of optical input/output in an integrated circuit in accordance with the teachings of the present invention. As shown in FIG. 3B, a first integrated circuit die 101, which is a flip chip packaged integrated circuit die, is coupled to a first package substrate 103 through ball bonds 105. A second integrated circuit die 159, which is also a flip chip packaged integrated circuit die, is coupled to a second package substrate 155 through ball bonds 157. In still another embodiment, first and second integrated circuit dice 101 and 159 may both be coupled to the same package substrate and include optical input/output in accordance with the teachings of the present invention.

As shown in FIG. 3B, in one embodiment, a first optical modulator 115 and a first optical demodulator 117 are disposed within a semiconductor substrate 153 of integrated circuit die 101. A second optical demodulator 119 and a second optical modulator 121 are disposed within a semiconductor substrate 161 of integrated circuit die 159. In one embodiment, first optical modulator 115 and first optical demodulator 117 are coupled to first integrated circuit node 107 in integrated circuit die 101, and second optical demodulator 119 and second optical modulator 121 are coupled to second integrated circuit node 109 in integrated circuit die 159.

In one embodiment, first and second optical modulators 115 and 121 utilize known semiconductor-based optical modulating techniques, such as for example but not limited to silicon-based optical modulation, polysilicon-based optical modulation, waveguide-based optical modulation, plasma optical modulation, etc. In one embodiment, first and second optical demodulators 117 and 119 utilize known optical demodulation techniques, such as for example but not limited to an active diffusion photo-diode.

In one embodiment, a thermal conductor or heat sink 209 of FIG. 3B is thermally and optically coupled to back sides 147 and 165 of integrated circuit dice 101 and 159, respectively. Heat sink 209 of FIG. 3B corresponds to and performs substantially the same function as heat sink 209 of FIG. 3A.

Therefore, optical input/output is realized between first and second integrated circuit nodes 107 and 109 of first and second integrated circuit dice 101 and 159, respectively, in accordance with the teachings of the present invention. In one embodiment, semiconductor substrates 153 and 161 include silicon and integrated circuit dice 101 and 159 include existing present day CMOS processing technology.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An integrated circuit device, comprising:
an optical modulator coupled to a first integrated circuit node, the optical modulator optically coupled to receive a light beam generated by a light source, the optical modulator to modulate and deflect the light beam in response to an output signal at the first integrated circuit node; and
an optical demodulator coupled to a second integrated circuit node, the optical demodulator optically coupled to the optical modulator to receive the modulated light beam deflected from the optical modulator, the optical demodulator to generate an input signal at the second integrated circuit node in response to the output signal such that the first integrated circuit node is coupled to the second integrated circuit node through a back side of the integrated circuit device, the integrated circuit device having a front side and the back side, the back side including a semiconductor substrate of the integrated circuit device.

2. The device of claim 1 wherein the first and second integrated circuit nodes are included in a first integrated circuit die, the first integrated circuit die having a front side and a back side, the back side of the first integrated circuit die including a semiconductor substrate of the first integrated circuit die.

3. The device of claim 2 wherein the optical modulator and the optical demodulator are disposed on a back side of the first integrated circuit die such that the optical modulator and optical demodulator are coupled to the first and second integrated circuit nodes, respectively, through the semiconductor substrate of the first integrated circuit die from the back side of the first integrated circuit die.

4. The device of claim 3 wherein the first integrated circuit die is included in a flip chip packaged integrated circuit.

5. The device of claim 3 further comprising a thermal conductor thermally coupled to the back side of the first integrated circuit die, wherein the optical modulator, the optical demodulator, an optical assembly and the light source are disposed within the thermal conductor, the optical assembly optically coupling the optical modulator and the optical demodulator.

6. The device of claim 1 wherein the first and second integrated circuit nodes are included in first and second integrated circuit dice, respectively, the first integrated circuit die having a front side and a back side, the back side of the first integrated circuit die including a semiconductor substrate of the first integrated circuit die, the second integrated circuit die having a front side and a back side, the back side of the second integrated circuit die including a semiconductor substrate of the second integrated circuit die.

7. The device of claim 6 wherein the optical modulator is disposed on the back side of the first integrated circuit die such that the optical modulator is coupled to the first integrated circuit node through the semiconductor substrate of the first integrated circuit die from the back side of the first integrated circuit die, wherein the optical demodulator is disposed on the back side of the second integrated circuit die such that the optical demodulator is coupled to the second integrated circuit node through the semiconductor substrate of the second integrated circuit die from the back side of the second integrated circuit.

8. The device of claim 7 wherein the first integrated circuit die is included in a first flip chip packaged integrated circuit and the second integrated circuit die is included in a second flip chip packaged integrated circuit.

9. The device of claim 7 further comprising a thermal conductor thermally coupled to the back side of the first integrated circuit die and to the back side of the second integrated circuit die, wherein the optical modulator, the optical demodulator, an optical assembly and the light source are disposed within the thermal conductor, the optical assembly optically coupling the optical modulator and the optical demodulator.

10. The device of claim 2 wherein the first integrated circuit die includes first and second recesses that form first and second optical passages, respectively, through the back side of the first integrated circuit die, the optical modulator and the optical demodulator disposed in the first and second recesses, respectively, such that the optical modulator and optical demodulator are optically coupled to an optical assembly through the first and second optical passages, respectively, the optical assembly optically coupling the optical modulator and the optical demodulator.

11. The device of claim 10 wherein the first integrated circuit die is included in a flip chip packaged integrated circuit.

12. The device of claim 10 wherein the first and second optical passages contain optically transparent material.

13. The device of claim 12 further comprising a thermal conductor thermally coupled to the back side of the first integrated circuit die, wherein the optical assembly and the light source are disposed within the thermal conductor.

14. The device of claim 6 wherein the first integrated circuit die includes a first recess that forms a first optical passage through the back side of the first integrated circuit die, the second integrated circuit die including a second recess that forms a second optical passage through the back side of the second integrated circuit die, the optical modulator disposed in the first recess such that the optical modulator is optically coupled to an optical assembly through the first optical passage, and the optical demodulator disposed in the second recess such that the optical demodulator is optically coupled to the optical assembly through the second optical passage, the optical assembly optically coupling the optical modulator and the optical demodulator.

15. The device of claim 14 wherein the first integrated circuit die is included in a first flip chip packaged integrated circuit and the second integrated circuit die is included in a second flip chip packaged integrated circuit.

16. The device of claim 15 wherein the first and second optical passages contain optically transparent material.

17. The device of claim 16 further comprising a thermal conductor thermally coupled to the back side of the first and second integrated circuit dice, wherein the optical assembly and the light source are disposed within the thermal conductor.

18. The device of claim 2 wherein the light beam comprises an infrared light beam, wherein optical modulator and the optical demodulator are disposed within the semiconductor substrate of the first integrated circuit die such that an optical assembly is optically coupled to the optical modulator and the optical demodulator via the infrared light beam through the semiconductor substrate of the first integrated circuit die from the back side of the first integrated circuit die.

19. The device of claim 18 wherein the semiconductor substrate comprises silicon.

20. The device of claim 18 wherein the first integrated circuit die is included in a flip chip packaged integrated circuit.

21. The device of claim 20 further comprising a thermal conductor thermally coupled to the back side of the first integrated circuit die, wherein the optical assembly and the light source are disposed within the thermal conductor.

22. The device of claim 6 wherein the light beam comprises an infrared light beam, wherein the optical modulator is disposed within the semiconductor substrate of the first integrated circuit die, wherein the optical demodulator is disposed within the semiconductor substrate of the second integrated circuit die, wherein an optical assembly is optically coupled to the optical modulator and the optical demodulator via the infrared light beam through the back side of the semiconductor substrate of the first integrated circuit die and from the back side of the semiconductor substrate of the second integrated circuit die.

23. The device of claim 22 wherein the semiconductor substrate of the first integrated circuit die and the semiconductor substrate of the second integrated circuit die comprise silicon.

24. The device of claim 22 wherein the first integrated circuit die is included in a first flip chip packaged integrated circuit and the second integrated circuit die is included in a second flip chip packaged integrated circuit.

25. The device of claim 24 further comprising a thermal conductor thermally coupled to the back sides of the first and second integrated circuit dice, wherein the optical assembly and the light source are disposed within the thermal conductor.

26. A method of transmitting a signal in an integrated circuit device, comprising:
 modulating a light beam in response to an output signal at a first integrated circuit node of the integrated circuit device, the integrated circuit device having a front side and a back side, the back side including a semiconductor substrate of the integrated circuit device;
 deflecting the modulated light beam; and
 demodulating the modulated light beam to generate an input signal at a second integrated circuit node such that the first integrated circuit node is coupled to the second integrated circuit node through the back side of the integrated circuit device.

27. A method of providing an integrated circuit device, comprising:
 disposing an optical modulator on a back side of an integrated circuit die, the integrated circuit die having a front side and the back side, the back side including a semiconductor substrate of the integrated circuit die;
 coupling the optical modulator to a first integrated circuit node from the back side of the integrated circuit die through the semiconductor substrate of the integrated circuit die;
 disposing an optical demodulator on the back side of the integrated circuit die; and
 coupling the optical demodulator to a second integrated circuit node from the back side of the integrated circuit die through the semiconductor substrate of the integrated circuit die.

28. A method of providing an integrated circuit device, comprising:
 forming a first recess in a first integrated circuit die from a back side of the first integrated circuit die to form a first optical passage, the first integrated circuit die having a front side and the back side, the back side including a semiconductor substrate of the first integrated circuit die;
 disposing an optical modulator in the first recess on the back side of the first integrated circuit die;
 coupling the optical modulator to a first integrated circuit node;
 forming a second recess in a second integrated circuit die from a back side of the second integrated circuit die to form a second optical passage, the second integrated circuit die having a front side and the back side, the back side including a semiconductor substrate of the second integrated circuit die;
 disposing the optical demodulator in the second recess on the back side of the second integrated circuit die;
 coupling the optical demodulator to a second integrated circuit node; and
 optically coupling the optical modulator and optical demodulator through the first and second optical passages.

29. A method of providing an integrated circuit device, comprising:
 disposing an optical modulator within a semiconductor substrate of a first integrated circuit die, the first integrated circuit die having a front side and a back side, the back side including the semiconductor substrate of the first integrated circuit die;
 disposing an optical demodulator within a semiconductor substrate of a second integrated circuit die, the second integrated circuit die having a front side and a back side, the back side including the semiconductor substrate of the second integrated circuit die, the optical modulator optically coupled to the optical demodulator via a modulated deflected light beam through the back side of the first integrated circuit, through the semiconductor substrate of the first integrated circuit, through the back side of the second integrated circuit, and through the semiconductor substrate of the second integrated circuit.

30. The method of claim 29 wherein the semiconductor substrate of the first integrated circuit die and the semiconductor substrate of the second integrated circuit die comprise silicon and the light beam comprises an infrared light beam.

31. An integrated circuit device, comprising:
 a light source that generates a light beam; and
 an optical assembly that directs the light beam through a back side of an integrated circuit die onto an optical output device disposed within a semiconductor substrate of the integrated circuit die, the integrated circuit die having a front side and the back side, the back side including the semiconductor substrate of the integrated circuit die, the optical assembly directing a deflected light beam deflected from the optical output device onto an optical input device disposed within the semiconductor substrate of the integrated circuit die.

32. The integrated circuit device of claim 31 wherein the light source and the optical assembly are disposed within a thermal conductor to be thermally coupled to the back side of the integrated circuit die.

33. The integrated circuit device of claim 31 wherein the optical output device comprises an optical modulator and the optical input device comprises an optical demodulator.

34. The integrated circuit device of claim 31 wherein the light beam and the deflected light beam comprise infrared light and wherein the semiconductor substrate comprises silicon.

* * * * *